(12) United States Patent
Kim

(10) Patent No.: US 7,262,454 B2
(45) Date of Patent: Aug. 28, 2007

(54) THIN FILM TRANSISTOR SUBSTRATE AND FABRICATING METHOD THEREOF

(75) Inventor: You Jin Kim, Seongnam-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 11/152,960

(22) Filed: Jun. 15, 2005

(65) Prior Publication Data

US 2006/0113538 A1 Jun. 1, 2006

(30) Foreign Application Priority Data

Dec. 1, 2004 (KR) .................. 10-2004-0100071

(51) Int. Cl.
*H01L 27/108* (2006.01)
(52) U.S. Cl. .................. 257/306; 438/149; 257/316; 257/347; 257/350
(58) Field of Classification Search ................ 257/306, 257/316, 347, 350, E27.1, E21.372
See application file for complete search history.

(56) References Cited

U.S. PATENT DOCUMENTS

| | | | | |
|---|---|---|---|---|
| 5,693,970 | A * | 12/1997 | Ikemasu ................. | 257/306 |
| 6,215,154 | B1 * | 4/2001 | Ishida et al. ........... | 257/347 |
| 2003/0197178 | A1 * | 10/2003 | Yamazaki et al. ..... | 257/59 |
| 2005/0062046 | A1 * | 3/2005 | Kim et al. ............. | 257/72 |
| 2005/0110019 | A1 * | 5/2005 | Ryu et al. .............. | 257/72 |
| 2005/0268984 | A1 * | 12/2005 | Seki et al. ............. | 141/1 |

FOREIGN PATENT DOCUMENTS

| | | |
|---|---|---|
| JP | 2003-289081 | 10/2003 |
| KR | 2003-0074089 | 9/2003 |

OTHER PUBLICATIONS

Office Action dated May 4, 2006 for corresponding Korean Patent Application No. 10-2004-0100071.

* cited by examiner

*Primary Examiner*—Thao P. Le
(74) *Attorney, Agent, or Firm*—Brink Hofer Gilson & Lione

(57) ABSTRACT

A thin film transistor substrate and a fabricating method thereof wherein a contacting size between an electrode and an active layer can be reduced to provide a small and light panel. In the thin film transistor substrate, a conductive layer is formed on the substrate. A first insulating layer for insulating the conductive layer overlies the conductive layer. A second insulating layer this is different from the first insulating layer overlies the first insulating layer. A third insulating layer overlies the second insulating layer. A contact through the first, second, and third insulating layers exposes a portion of the conductive layer and has a trapezoidal section. An electrode is connected to the conductive layer and overlies a portion of an inclined face of the contact hole. The inclined face of the contact hole includes a protrusion formed by a portion of the second insulating layer and creates an overhang structure.

12 Claims, 19 Drawing Sheets

US 7,262,454 B2

THIN FILM TRANSISTOR SUBSTRATE AND FABRICATING METHOD THEREOF

This application claims the benefit of Korean Patent Application No. P2004-100071 filed in Korea on Dec. 1, 2004, which is hereby incorporated by reference.

BACKGROUND

1. Technical Field

This invention relates to a thin film transistor substrate and a fabricating method thereof, and more particularly to a thin film transistor substrate and a fabricating method thereof wherein a contact size between an electrode and an active layer can be reduced to provide a small and light panel.

2. Description of the Related Art

Generally, a liquid crystal display (LCD) allows each liquid crystal cell that is arranged on a liquid crystal display panel in a matrix to control the light transmittance in accordance with a video signal, thereby displaying a picture.

In each liquid crystal cell, a thin film transistor (TFT) is used as a switching device for supplying a video signal independently. An active layer of such a TFT employs an amorphous silicon (amorphous-Si) or polycrystalline silicon (poly-Si). Herein, when the poly-Si is used, a driving circuit requiring a high response speed can be built in the liquid crystal display panel because the poly-Si has approximately hundred times faster charge mobility than the amorphous-Si.

FIG. 1 schematically shows a liquid crystal display panel employing a conventional poly-TFT.

Referring to FIG. 1, the liquid crystal display panel includes a picture display part 96, a data driver 92 for driving a data line 4 of the picture display part 96, and a gate driver 94 for driving a gate line 2 of the picture display part 96.

The picture display part 96 has liquid crystal cells LC arranged in a matrix to display a picture. Each of the liquid crystal cells LC includes a TFT 30 connected to the gate line 2 and the data line 4. The TFT 30 charges a video signal from the data line 4 into the liquid crystal cell LC in response to a scanning signal from the gate line 2. In response to the charged video signal, the liquid crystal cell LC reacts a liquid crystal having a dielectric anisotropy to control light transmittance, thereby implementing a gray level.

The gate driver 94 sequentially drives the gate line 2. The data driver 92 applies a video signal to the data line 4 whenever the gate line 2 is driven.

Such a liquid crystal display panel is formed by joining a TFT substrate, provided with the data driver 92 and the gate driver 94 along with the TFT 30 of the liquid crystal cell LC, to a color filter substrate provided with a common electrode and a color filter, etc. with a liquid crystal therebetween.

FIG. 2 is a partial plan view of a picture display part of the TFT substrate included in the liquid crystal display panel shown in FIG. 1, and FIG. 3 is a section view of the TFT substrate taken along section line III-III of FIG. 2.

Referring to FIG. 2 and FIG. 3, the picture display part of the TFT substrate includes a TFT 30 connected to the gate line 2 and the data line 4, and a pixel electrode 22 connected to the TFT 30. The TFT 30 may be formed as an N-type or P-type TFT, but the TFT 30 formed as an N-type only will be described below.

The TFT 30 charges a video signal into the pixel electrode 22. To this end, the TFT 30 includes a gate electrode 6 connected to the gate line 2, a source electrode included in the data line 4, and a drain electrode 10 connected via a pixel contact hole 20 passing through the pixel electrode 22 and the protective film 18. The gate electrode 6 overlaps with a channel area 14C of the active layer 14 provided on a buffer film 16 with having a gate insulating film 12 therebetween. The source electrode and the drain electrode 10 are formed in such a manner to be insulated from the gate electrode 6 with having an interlayer insulating film 26 therebetween. Further, the source electrode and the drain electrode 10 are connected, via a source contact hole 24S and a drain contact hole 24D passing through the interlayer insulating film 26 and the gate insulating film 12, to a source area 14S and a drain area 14D of the active layer 14, which are doped with an $n^+$ impurity, respectively. The active layer may include a lightly doped drain (LDD) area (not shown) doped with an $n^-$ impurity between the channel area 14C and the source and drain areas 14S and 14D in order to reduce an off current.

A formation of the contact hole 24 and the electrode 10 on such a poly-TFT substrate will be described with reference to FIG. 4A to FIG. 4C below.

Firstly, referring to FIG. 4A, in the poly-TFT substrate, the buffer film 16 is formed on a lower substrate 1 and then the active layer 14 is formed on the buffer film 16. Further, the gate insulating film 12 is formed at the upper portion of the active layer 14 and then the interlayer insulating film 26 is formed thereon.

The active layer 14 is formed by depositing amorphous-Si on the lower substrate 1 and then crystallizing it by a laser into a poly-Si; and thereafter by patterning it by a photolithography and etching process using a mask.

The gate insulating film 12 is formed by entirely depositing an inorganic insulating material such as $SiO_2$, and the like.

The interlayer insulating film 26 is formed by blanket depositing an inorganic insulating material such as $SiO_2$, and the like on the gate insulating film 12.

Referring to FIG. 4B, the interlayer insulating film 26 and the gate insulating film 12 have a contact hole 24 formed therethrough a photolithography and etching process. More specifically, in the photolithography process, the photo-resist pattern is formed by coating a photo-resist onto the interlayer insulating film 26; and then partially exposing to light by arranging a patterned mask at the upper portion of the photo-resist and developing the photo-resist. Thereafter, the contact hole 24 is formed by dry etching and wet etching. The contact hole 24 formed in this manner has a slope, and a section thereof is formed in a trapezoidal shape.

Referring to FIG. 4C, the electrode 10 is deposited onto the surface of the contact hole 24 using a mask. In this case, the electrode 10 is formed in such a manner to cover the entire surface of the contact hole 24 and the peripheral of the aperture of the interlayer insulating film 26.

In reality, when the contact hole 24 connected to the active layer 14 is designed to have a size of 4 μm, a size of the upper contact hole 24 provided at the aperture on the interlayer insulating film 26 becomes about 7 μm and the width of the electrode 10 becomes 11 μm.

As described above, the conventional electrode 10 has a problem in that, since it is formed in such a manner to cover the whole portion of upper contact hole 24 provided at the aperture of the interlayer insulating film 26, it has a large width. Accordingly, there has been suggested a scheme of maximizing a slope of the contact hole 24 in order to reduce a size of the contact hole 24. However, when a slope of the contact hole 24 is maximized, there is a problem in that an electrode 10a, provided at the periphery of the aperture of the interlayer insulating film 26, and an electrode 10b, provided at the contact hole 24, not connected to each other, as shown in FIG. 5. Also, it is necessary to use a wet etching process for the purpose of protecting the active layer 14 when the contact hole 24 is formed. Thus, the contact hole 24 has a slope that is greater than a desired angle, which causes a problem in maximizing a slope of the contact hole 24. Such a formation of the contact hole fails to satisfy the need for a small size contact hole 24, which is required for a small-dimension and light-weight panel.

BRIEF SUMMARY

Accordingly, it is an object of the present invention to provide a thin film transistor substrate and a fabricating method thereof wherein the contact size between an electrode and an active layer can be reduced to provide a small and light panel.

In order to achieve these and other objects of the invention, a thin film transistor substrate according to one aspect of the present invention includes a substrate and a conductive layer overlying the substrate. A first insulating layer for insulating the conductive layer overlies the conductive layer and a second insulating layer comprising a material different from the first insulating layer overlies the first insulating layer. A third insulating layer overlies the second insulating layer. A contact through the first, second, and third insulating layers exposes a portion of the conductive layer and having a trapezoidal section, and an electrode is connected to the conductive layer and overlies a portion of an inclined face of the contact hole. The inclined face of the contact hole includes a protrusion formed by a portion of the second insulating layer and creating an overhang structure.

In the thin film transistor substrate, wherein the first and third insulating layers are made from an inorganic insulating material such as $SiO_2$, and a material of the second insulating layer has a good adhesive force to a metal and is an inorganic insulating material, such as $SiN_x$, different from the third insulating layer.

Herein, a size ratio of the bottom of the contact hole to the top of the contact hole to the top of the electrode is about 3~5:8~10:7~9.

A method of fabricating a thin film transistor substrate according to another aspect of the present invention includes the steps of providing a substrate and forming a conductive layer on the substrate; forming a first insulating layer for insulating the conductive layer on the conductive layer; forming a second insulating layer on the first insulating layer on the first insulating layer, wherein the second insulating layer comprises a material different from the first insulating layer; forming a third insulating layer on the second insulating layer; forming a contact through the first, second, and third insulating layers to expose a portion of the conductive layer and having a trapezoidal section; forming an electrode connected to the conductive layer and partially provided on an inclined face of the contact hole; and providing a protrusion creating an overhang structure at one side of an inclined face of the contact hole.

In the method, said step of providing the protrusion includes etching the third insulating layer by at least one of a dry etching and a wet etching; etching the second insulating layer by at least one of said dry etching and said wet etching; and etching the first insulating layer by said wet etching.

Herein, the second insulating layer is etched using both the dry etching method and the wet etching method. A ratio of a number of times the dry etching method is used to a number of times the wet etching method is used is about 80~50:20~50.

In the method, said etchant liquid used in said wet etching is selected from at least one of a buffered oxide etchant (BOE) and a buffered —HF, and an etchant gas used in said dry etching is selected from at least one of $SF_6$ and $CF_4$.

In the method, the first and third insulating layers are made from an inorganic insulating material such as $SiO_2$, and a material of the second insulating layer has a good adhesive force to a metal and is an inorganic insulating material, such as $SiN_x$, different from the third insulating layer.

A thickness of the second insulating layer is greater than about 500 Å and less than about 1.5 times of the thickness of the first insulating layer.

A liquid crystal display according to one aspect of the present invention includes a thin film transistor having an active region and a first, second and third insulating layers sequentially overlying the thin film transistor. The second insulating layer comprises a material different from the first insulating layer. A contact opening through the first, second, and third insulating layers exposes a portion of the active region. An electrode is connected to the active region and overlies only a portion of an inclined face of the contact hole. The electrode has a characteristic dimension that is less than a characteristic dimension of the contact opening at an upper surface of the third insulating layer, but greater than a characteristic dimension of the contact opening at the active region.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENT

Reference will now be made in detail to the preferred embodiments of the present invention, examples of which are illustrated in the accompanying drawings.

Hereinafter, the preferred embodiments of the present invention will be described in detail with reference to FIGS. 6 to 11.

Figure 1:
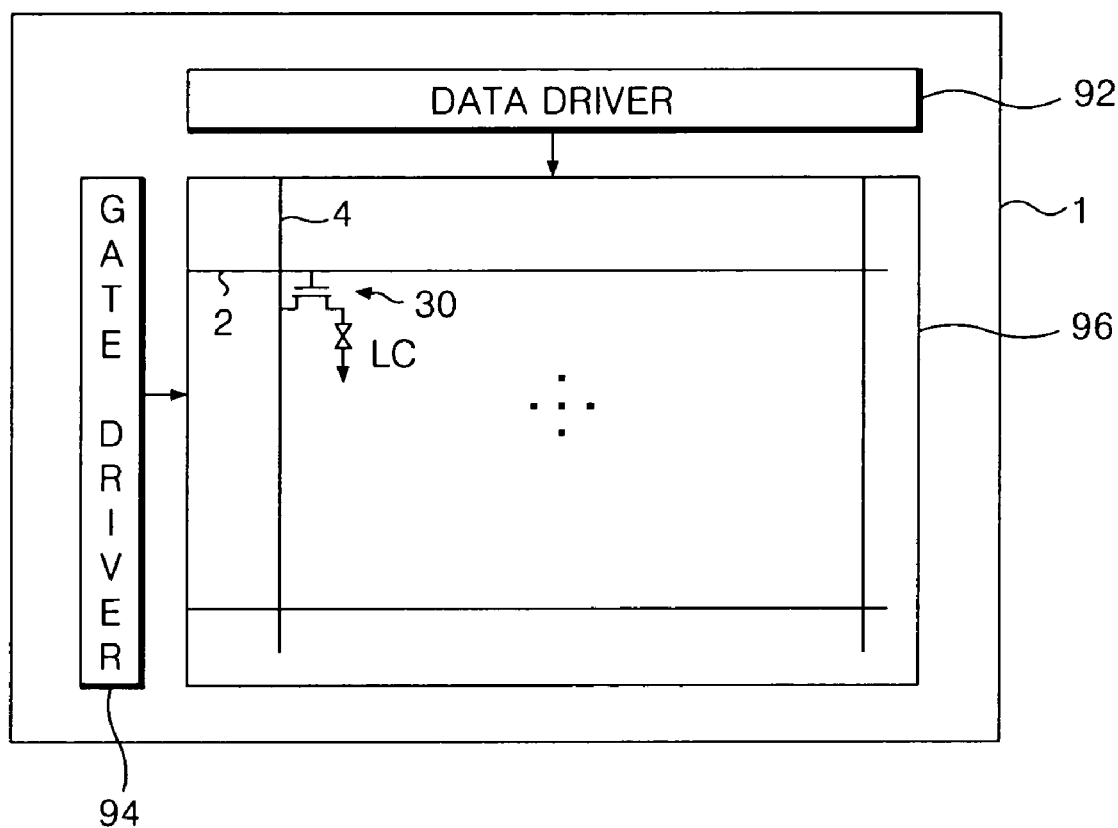
FIG. 1 is a schematic view showing a structure of a conventional liquid crystal display employing a poly silicon.
Figure 2:
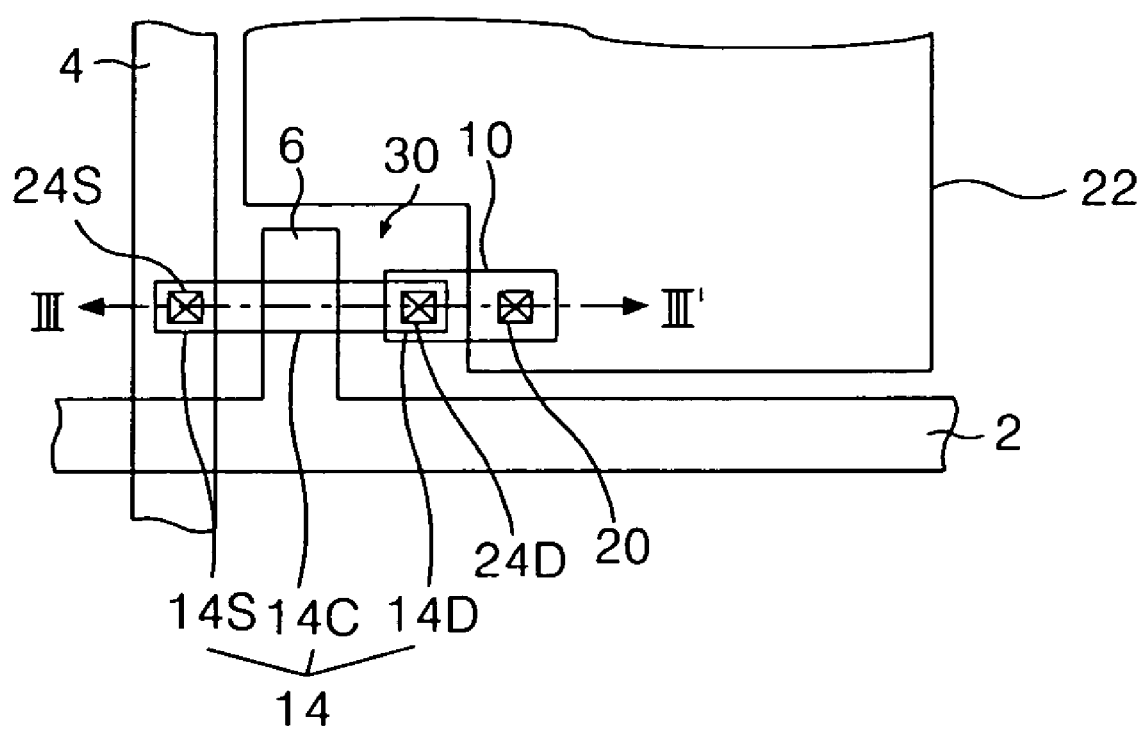
FIG. 2 is a fractional plan view of a picture display part of the thin film transistor substrate included in the liquid crystal display panel shown in FIG. 1.
Figure 3:
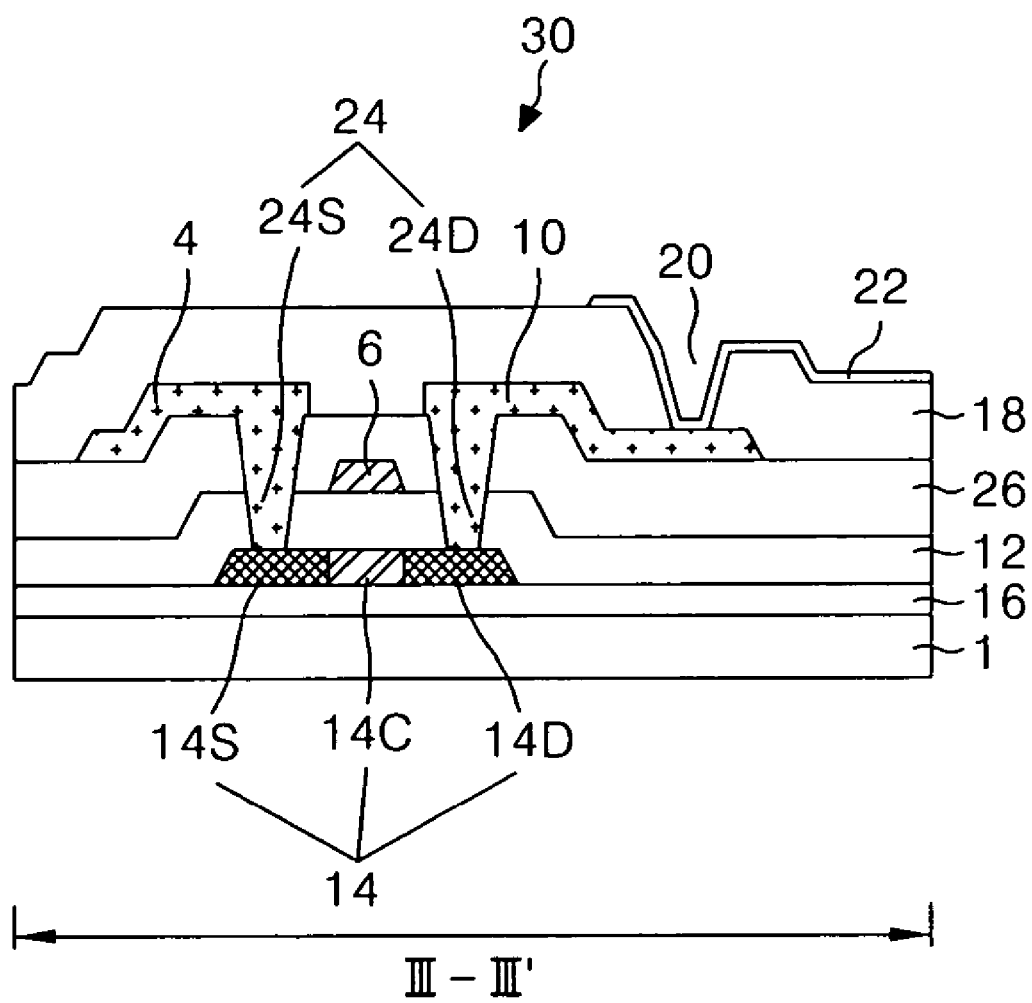
FIG. 3 is a section view of the TFT substrate taken along section lines III-III' of FIG. 2.
Figure 4A:
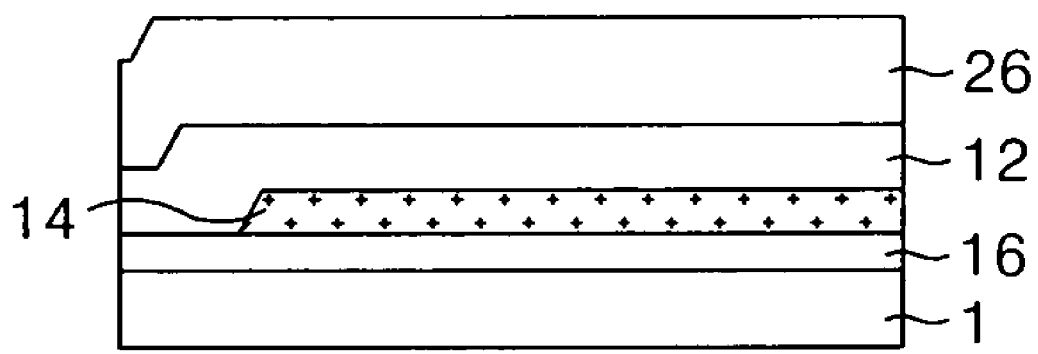
FIG. 4A to FIG. 4C are section views for explaining a method of fabricating the thin film transistor substrate shown in FIG. 3 step by step.
Figure 4B:
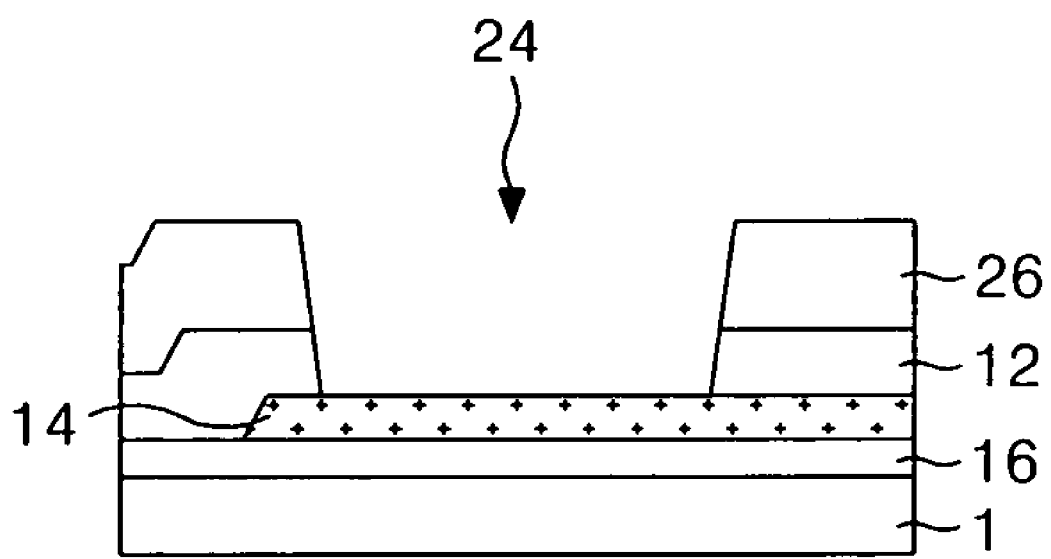
Figure 4C:
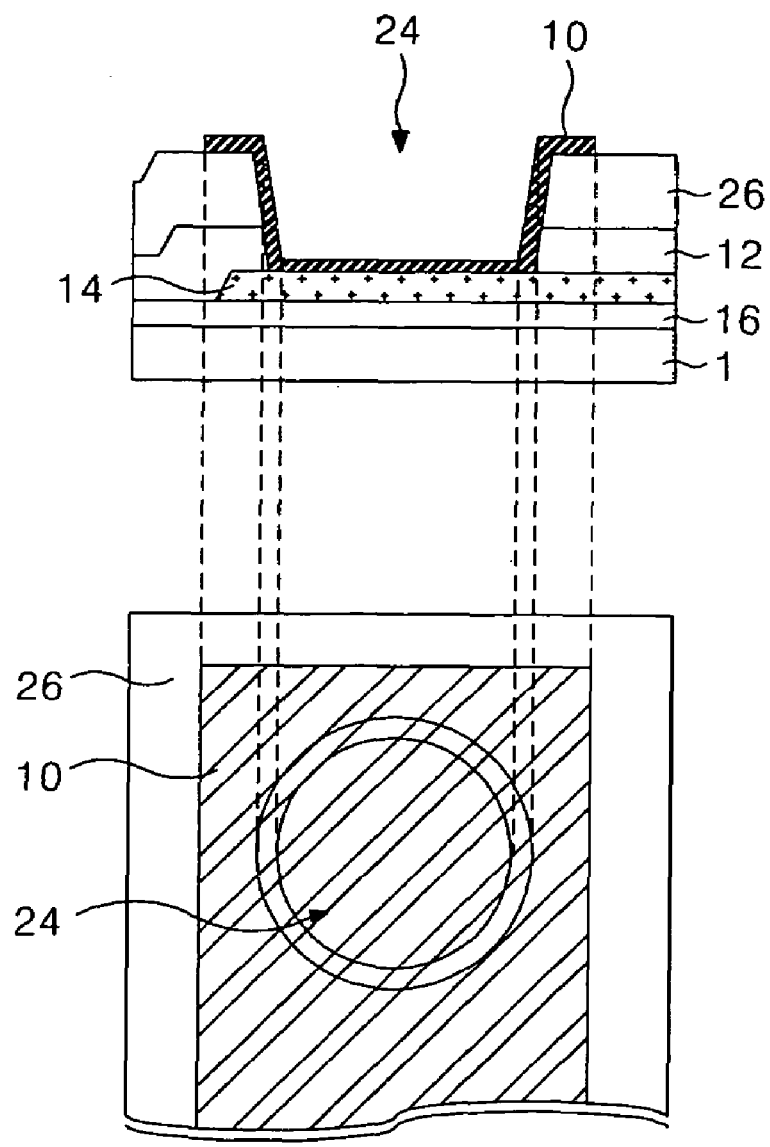
Figure 5:
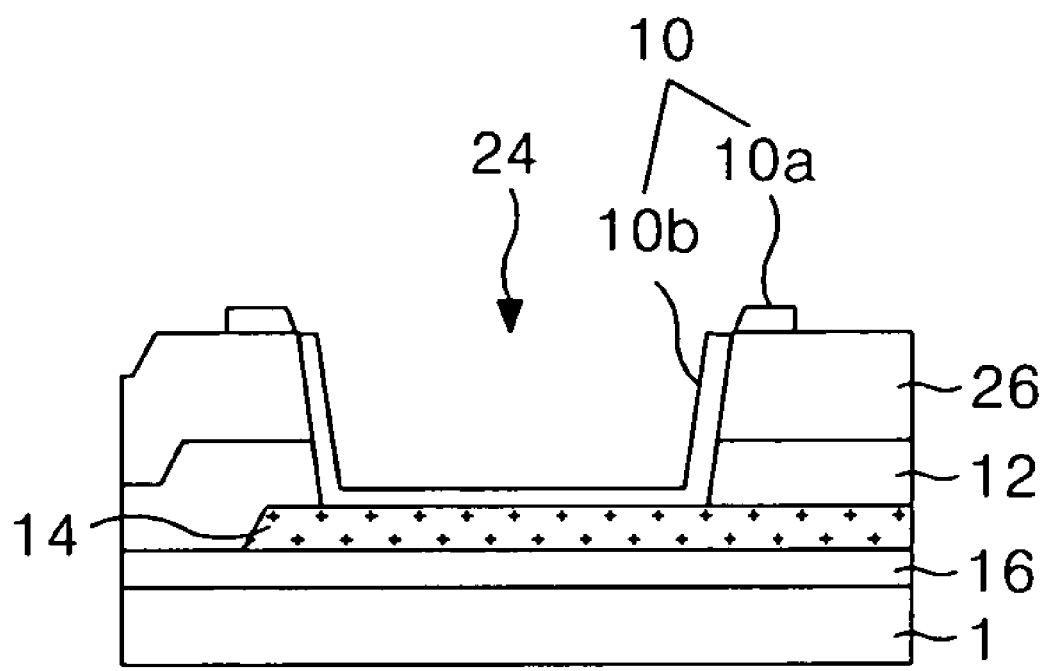
FIG. 5 depicts a breakage of the electrode provided at the conventional contact hole.
Figure 6:
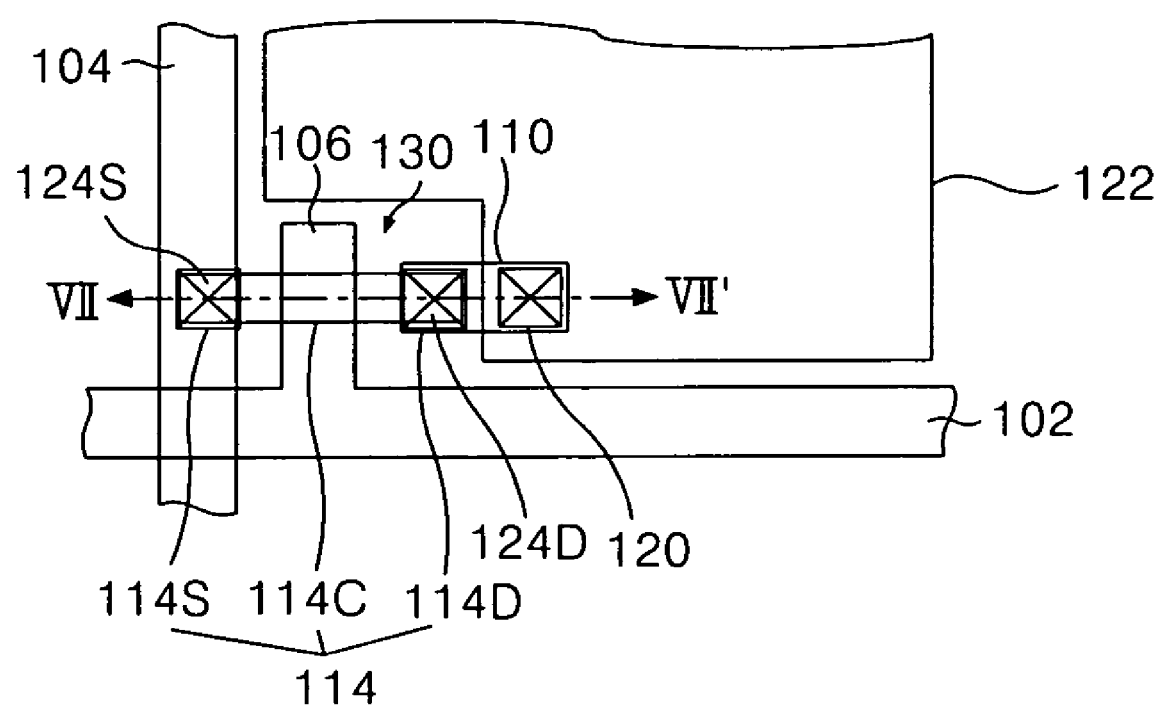
FIG. 6 is a fractional plan view of the thin film transistor substrate according to a first embodiment of the present invention.
Figure 7:
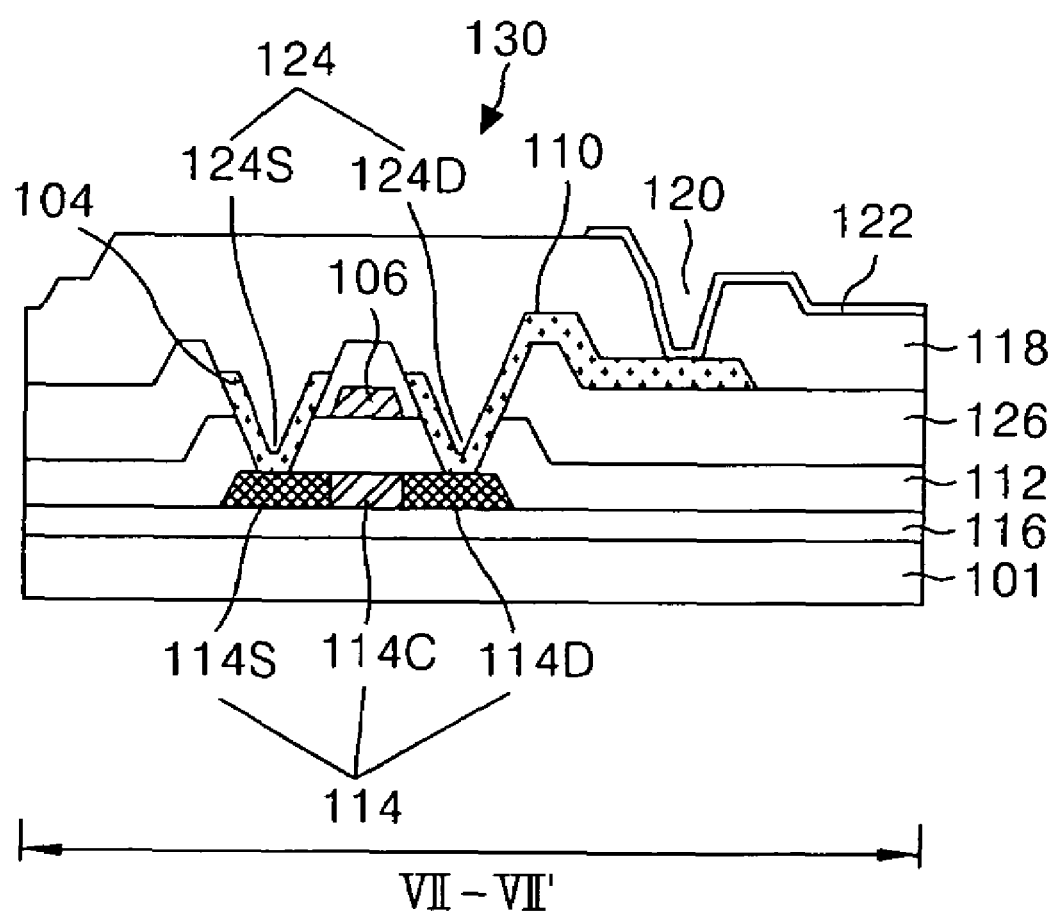
FIG. 7 is a section view of the thin film transistor substrate taken along the VII-VII' line in FIG. 6.

FIG. 6 is a fractional plan view of the thin film transistor substrate according to a first embodiment of the present invention; and FIG. 7 is a section view of the thin film transistor substrate taken along the VII-VII' line in FIG. 6.

Referring to FIG. 6 and FIG. 7, the TFT substrate includes a TFT 130 connected to a gate line 102 and a data line 104, and a pixel electrode 122 connected to the TFT 130. The TFT 130 may be formed in as an N-type or P-type TFT, but the TFT 130 formed as an N-type only will be described below.

The TFT 130 charges a video signal into the pixel electrode 122. To this end, the TFT 130 includes a gate electrode 106 connected to the gate line 102, a source electrode included in the data line 104, a pixel contact hole 120 passing through a protective film 118, a drain electrode 110 connected, via the pixel contact hole 120, to the pixel electrode 122, and an active layer 114 for forming a channel between the source electrode and the drain electrode 110 by the gate electrode 106.

The active layer 114 is provided on a lower substrate 101 with a buffer film 116 therebetween. The gate electrode 106 connected to the gate line 102 overlaps a channel area 114C of the active layer 114 with a gate insulating film 112 therebetween. The data line 104 and the drain electrode 110 are formed in such a manner to be insulated from the gate electrode 106 by an interlayer insulating film 126. Further, the source electrode, included in the data line 104, and the drain electrode 110 are connected, via a source contact hole 124S and a drain contact hole 124D passing through the interlayer insulating film 126 and the gate insulating film 112, to a source area 114S and a drain area 114D doped with an n$^+$ impurity, respectively. The active layer 114 may further include a lightly doped drain (LDD) area (not shown) doped with an n$^-$ impurity between the channel area 114C and the source and drain areas 114S and 114D in order to reduce an off current. Herein, the source electrode and the drain electrode 110 and the pixel electrode 122 formed through the respective contact holes 120, 124S and 124D have smaller widths than upper hole sizes of the contact holes 120, 124S and 124D.

A formation process of the source electrode and the drain electrode 110 going through the source drain contact holes 124S and 124D according to the first embodiment of the present invention having the above-mentioned structure will be described with reference to FIG. 8A to FIG. 8C below.

Figure 8A:
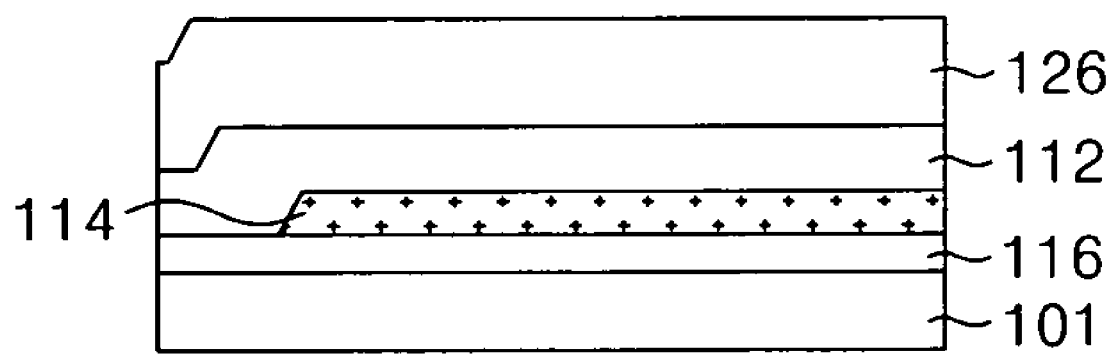
FIG. 8A to FIG. 8C are section views for explaining a method of fabricating the thin film transistor substrate according to the first embodiment of the present invention step by step.

Firstly, referring to FIG. 8A, in the TFT substrate according to the first embodiment of the present invention, the buffer film 116 is blanket deposited onto the lower substrate 101, and the active layer 114 is formed on the buffer film 116. Further, the gate insulating film 112 is formed on the upper portion of the active layer 114 and then the interlayer insulating film 126 is formed thereon.

The active layer 114 is formed by depositing amorphous-Si on the lower substrate 101 and then crystallizing it by a laser into a poly-Si; and thereafter by patterning it by a photolithography and etching process using a mask.

The gate insulating film 112 is formed by blanket depositing an inorganic insulating material such as SiO$_2$, and the like.

The interlayer insulating film 126 is formed by entirely depositing an inorganic insulating material such as SiO$_2$, and the like onto the gate insulating film 112.

Figure 8B:
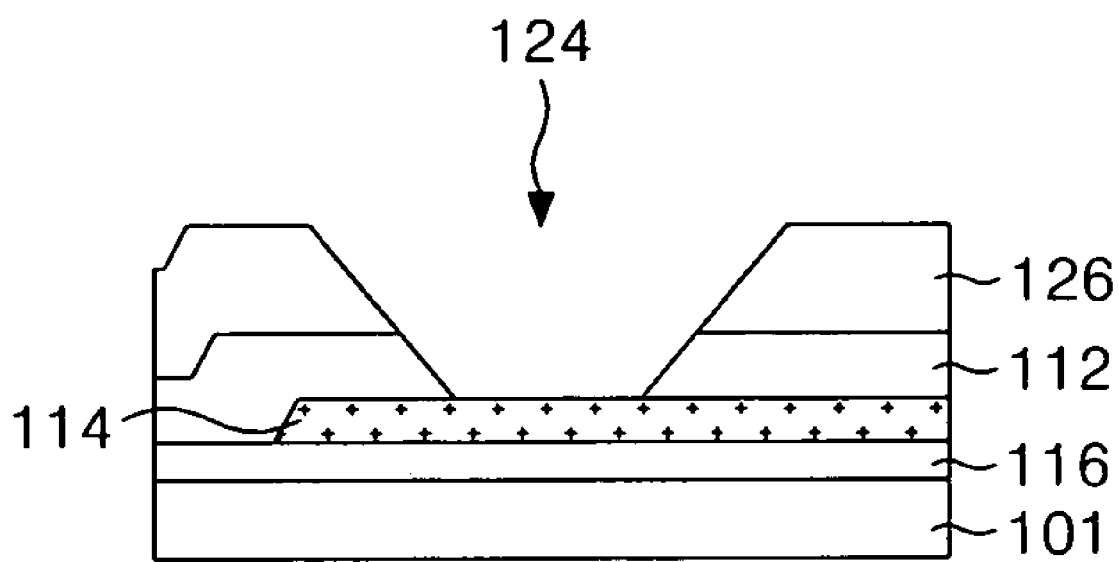

Referring to FIG. 8B, the interlayer insulating film 126 and the gate insulating film 112 has a contact hole 124 formed therethrough by a photolithography and etching process. This contact hole 124 forms a slow inclination angle by controlling the ratio of dry etching to wet etching. More specifically, an etching process is performed having a rate with at a ratio of dry etching to wet etching corresponding to about 80~50:20~50, and preferably about 60:40. By carrying out such an etching process, a low inclination angle of the contact hole 124 is achieved according to the first embodiment of the present invention.

Figure 8C:
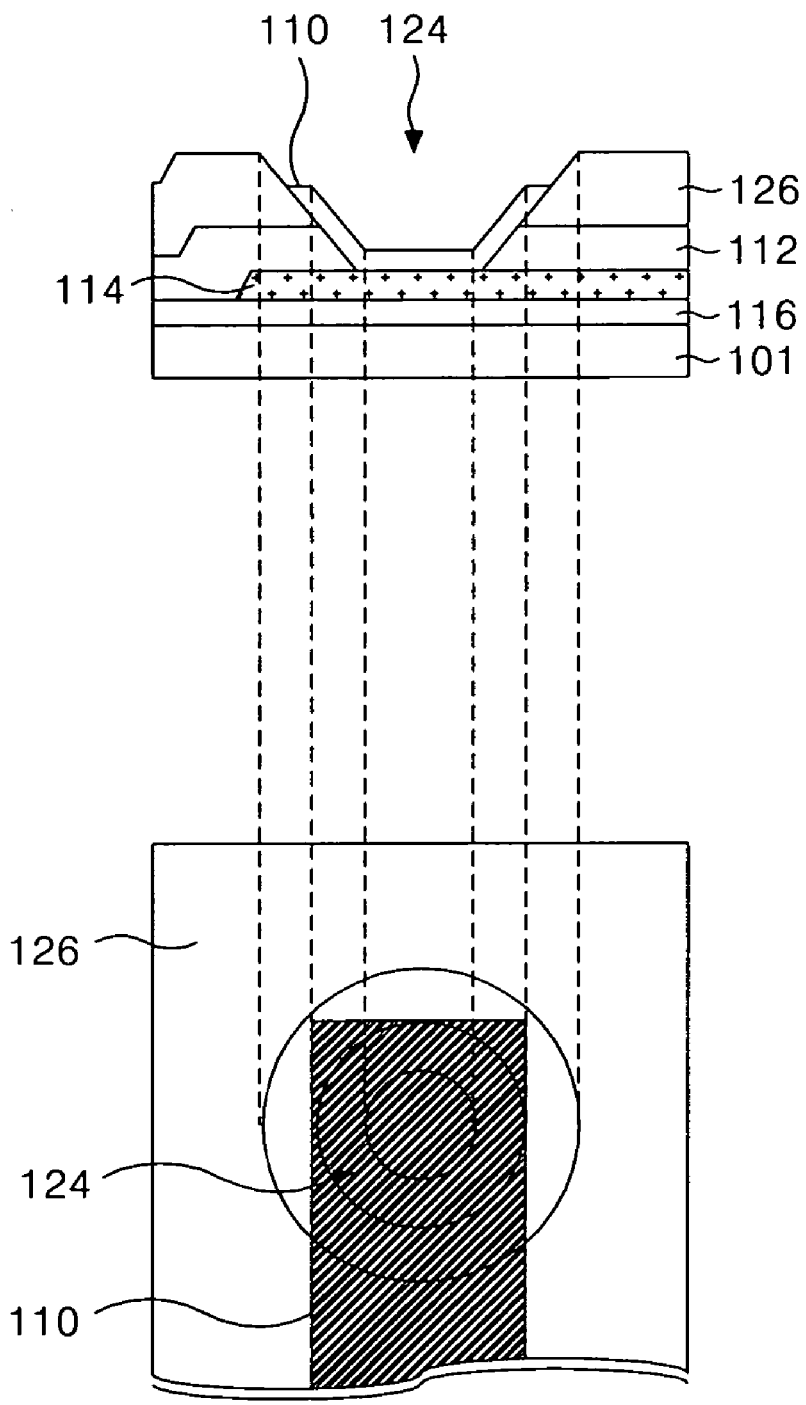

Referring to FIG. 8C, the electrode 110 is deposited onto the surface of the contact hole 124 using a mask. In this case, a size of the mask pattern is set to have a smaller value than a characteristic dimension of the contact hole 124 at the upper surface of the insulating film 126. Thus, the electrode 110 is formed on one side of both the inclined surface of the contact hole 124 and the lower portion of the contact hole 124. In this case, a width of the electrode 110 is set to be less than a characteristic dimension of the contact hole 124 at the top and greater than the size of the contact hole 124 at the bottom.

In one exemplary embodiment, when the lower hole size of the contact hole 124 is designed to have a dimension of about 4 μm, the upper hole dimension size of the contact hole 124 is about 9 μm and a total length of the width of the electrode 110 is about 8 μm. Accordingly, a width of the electrode 110 connected, via the contact hole 124, to the active layer 114 is reduced.

Referring back to FIGS. 6 and 7, since the pixel electrode 122 going through a pixel contact hole 120 can be formed by the same process as the formation process of the source contact hole 124S and the drain contact hole 124D, an explanation as to it will be omitted.

Since the TFT substrate according to the first embodiment of the present invention having the above-mentioned structure is formed such that an adhesive force between the electrode 110 and the contact hole 124 may be weak, there is a possibility that an etchant liquid used in the etching process to form the electrode 110 can infiltrate into the active layer 114 and cause substrate defects. Accordingly, a second embodiment of the present invention provides a structure in which infiltration of the etchant liquid can be prevented when the electrode is formed in the contact hole.

Figure 9:
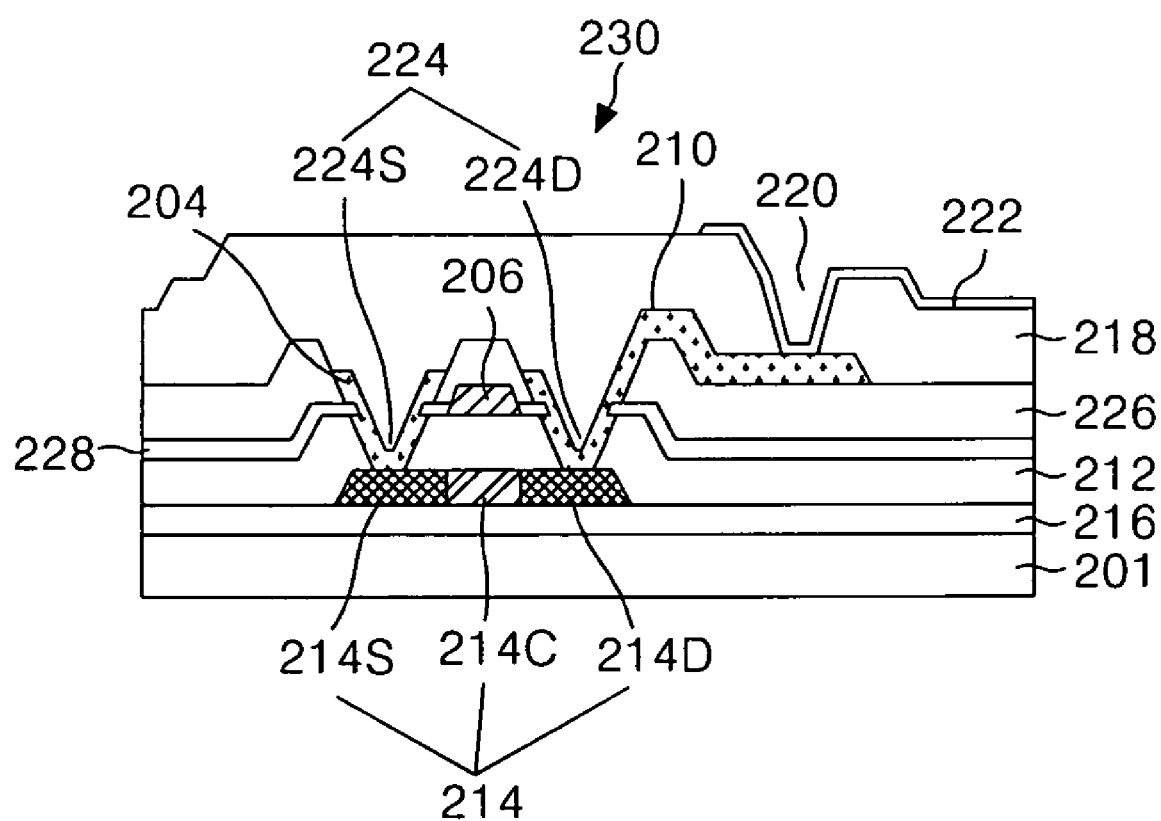
FIG. 9 is a fractional plan view of the thin film transistor substrate according to a second embodiment of the present invention.

FIG. 9 shows a TFT substrate including a TFT 230 connected to a gate line (not shown) and a data line 204, and a pixel electrode 222 connected to the TFT 230. A drain electrode 210 is connected to an active layer 214 through the contact hole 224 according to the second embodiment of the present invention. A pixel contact hole 220 passes through a protective film 218 and exposes portion of the drain electrode 210. The drain electrode 210 is connected, via the pixel contact hole 120, to the pixel electrode 222. An active layer 214 forms a channel 214C between a source region 214S and a drain region 214D. A gate electrode 206 overlies the channel region 214C and is separated therefrom by a portion of a gate insulating film 212. The data line 204 is connected to a source region 214S through a source contact hole 224S and the drain electrode 210 is connected to the drain region 214D through a drain contact hole 214D.

A formation process of the contact hole 224 and the electrode 210 going through the contact hole 224 according to the second embodiment of the present invention shown in FIG. 9 will be described in detail with reference to FIG. 10A to FIG. 10C below.

Figure 10A:
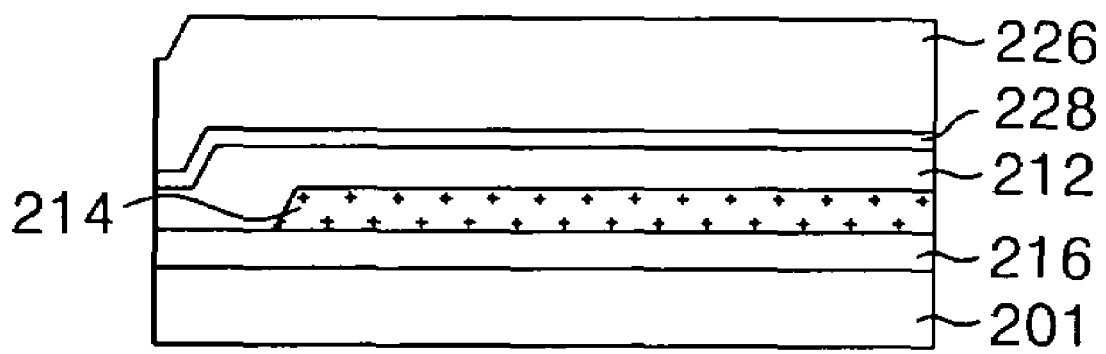
FIG. 10A to FIG. 10C are section views for explaining a method of fabricating the thin film transistor substrate according to the second embodiment of the present invention step by step.

Referring to FIG. 10A, in the TFT substrate according to the second embodiment of the present invention, the buffer film 216 is blanket deposited onto the lower substrate 201, and the active layer 214 is formed on the buffer film 216. Further, the gate insulating film 212 is formed on the upper portion of the active layer 214 and then an auxiliary insulating film 228 having a different material from the gate insulating film 212 is formed on the gate insulating film 212. Thereafter, the interlayer insulating film 226 is formed thereon.

The active layer 214 is formed by depositing amorphous-Si on the lower substrate 101 and then crystallizing it by a laser into a poly-Si; and thereafter by patterning it by a photolithography and etching process using a mask.

The gate insulating film 112 is formed by blanket depositing an inorganic insulating material such as $SiO_2$, and the like.

The auxiliary insulating film 228 is formed by blanket depositing an inorganic insulating material different from the gate insulating film 212, such as $SiN_x$, and the like.

The interlayer insulating film 226 is formed by blanket depositing an inorganic insulating material such as $SiO_2$, and the like onto the gate insulating film 212.

Figure 10B:
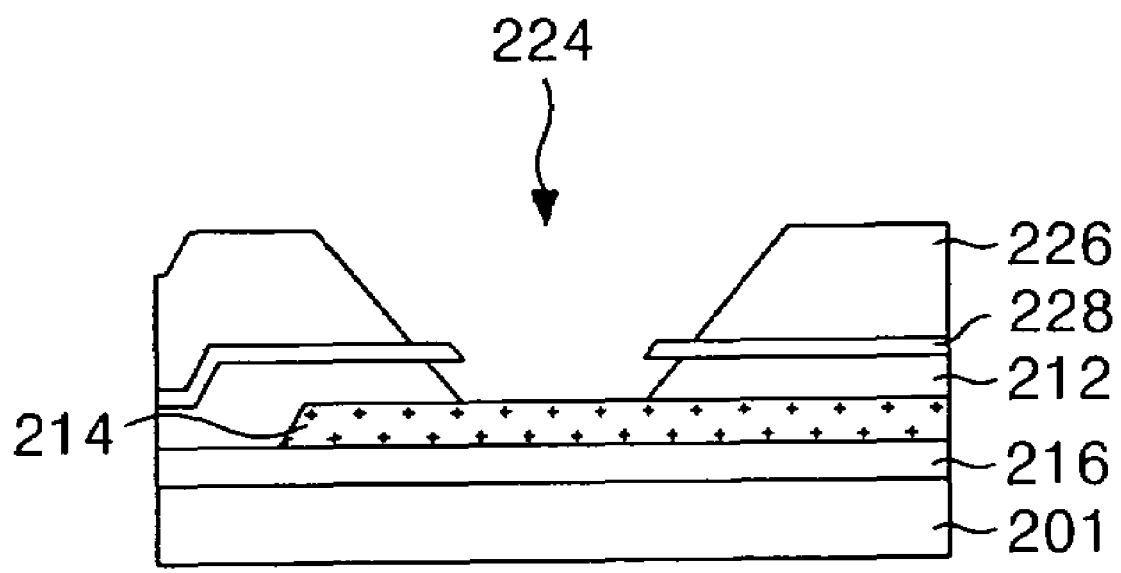
Figure 11A:
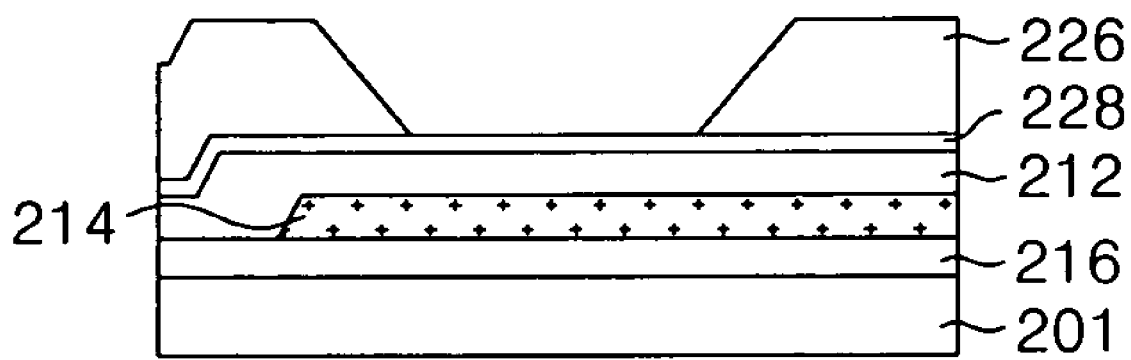
FIG. 11A to FIG. 11C are section views for explaining a method of fabricating the thin film transistor substrate shown in FIG. 10B step by step.
Figure 11B:
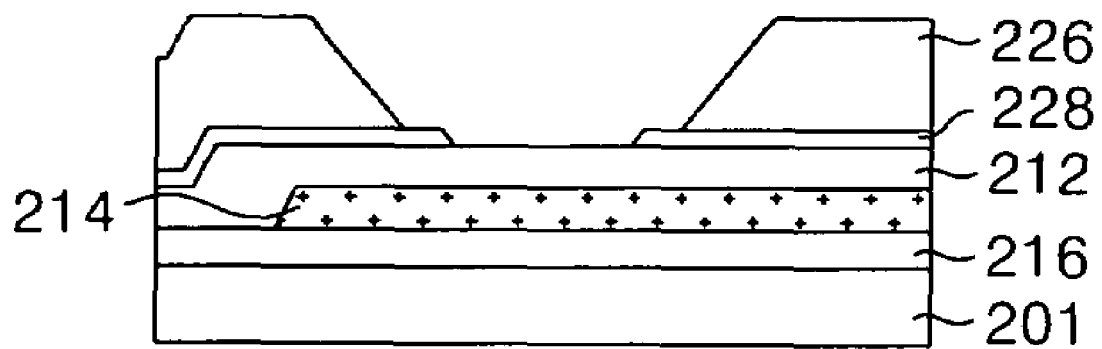
Figure 11C:
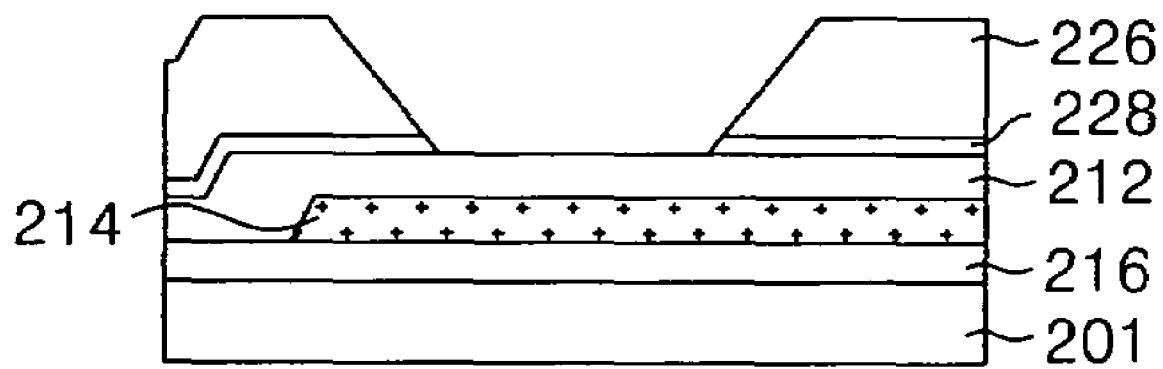

Referring to FIG. 10B, the interlayer insulating film 226 and the gate insulating film 212 has a contact hole 224 formed therethrough by a photolithography and etching process. This contact hole 224 is formed to have a low inclination angle by controlling the ratio of dry etching to wet etching. More specifically, the interlayer insulating film 226 is etched by a dry etching process and a wet etching process as shown in the process sequence illustrated FIGS. 11A-11C. Herein, the ratio of dry etching to wet etching can be set differently depending upon the thickness of the interlayer insulating layer 226. In order to reduce the size of the contact hole 224, it is preferable that the dry etching rate is higher. In this case, an etching speed is different because the interlayer insulating film 226 and the auxiliary insulating film 228 are made from different materials. The etching of the interlayer insulating film 226 progresses faster than that of the auxiliary insulating film 228. Thus, the structure of the contact hole 224 takes a stepwise shape as shown in FIG. 11B when the auxiliary insulating film 228 is etched only by the wet etching process, whereas it takes a shape as shown in FIG. 11C when the auxiliary insulating film 228 is etched by the dry etching process. Finally, the gate insulating film 212 is etched only by the wet etching process. In this case, the wet etching of the gate insulating film 212 progresses faster than that of the auxiliary insulating film 228, so that a protrusion is created by the auxiliary insulating film 228 that forms an overhang structure and the contact hole 224 has a low inclination angle. Herein, sizes of the protrusions of the auxiliary insulating films 228 formed in accordance with the processes of FIG. 11B and FIG. 11C are set differently. In other words, the length of the protrusion formed in the process of FIG. 11B is set to have a larger value than the protrusion formed in the process of FIG. 11C. Thus, an etching process of the auxiliary insulating film 228 has preferably a ratio of dry etching to wet etching corresponding to about 50~70:50~30, and more preferably a ratio of approximately 60:40.

Figure 10C:
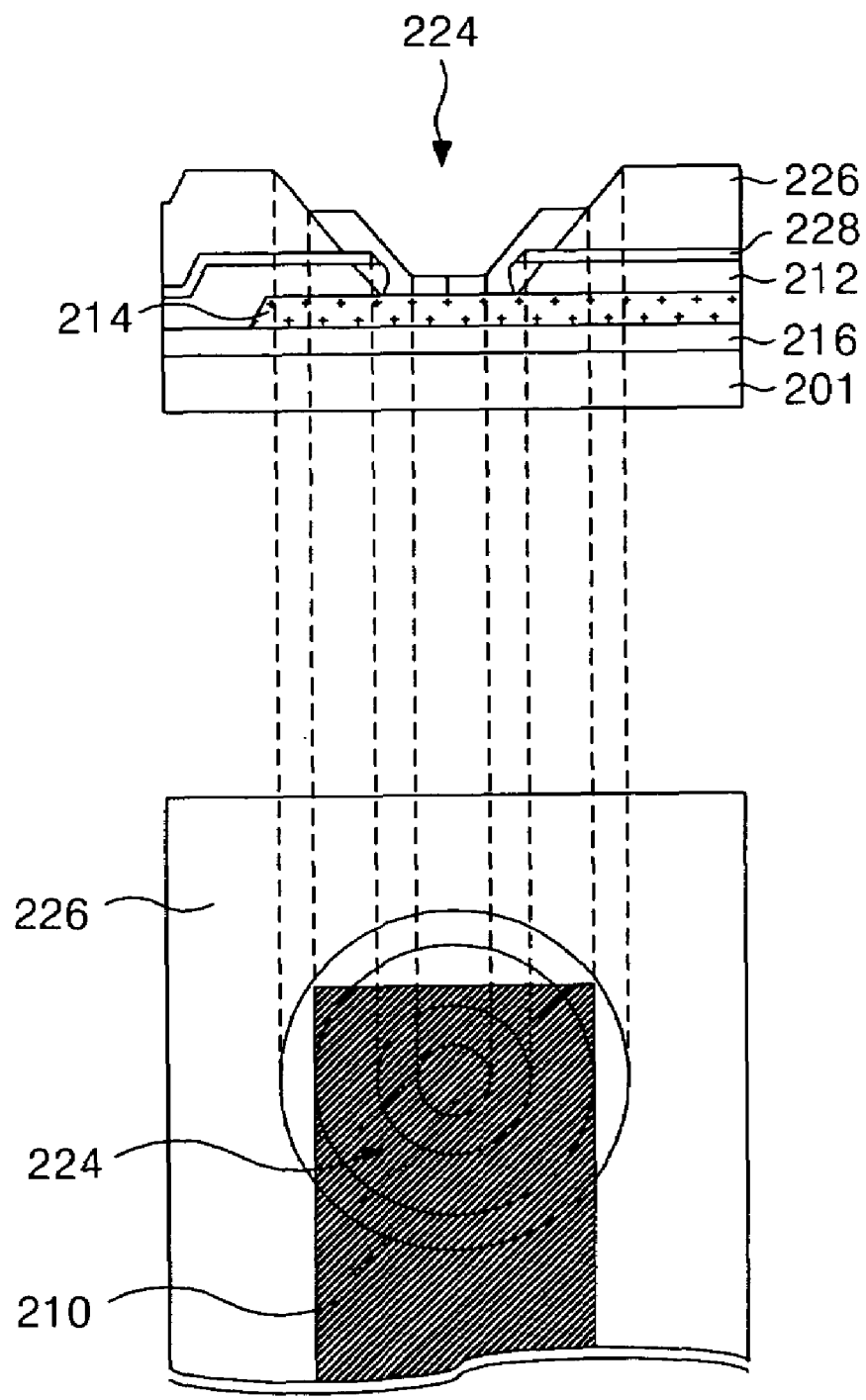

Referring to FIG. 10C, the electrode 210 is deposited onto the surface of the contact hole 224 using a mask. In this case, a size of the mask pattern is set to have a smaller value than an upper hole size of the contact hole 224. Thus, the electrode 210 is formed on one side of both the inclined surface of the contact hole 224 and a lower portion of the of the contact hole 224. In this case, a width of the electrode 210 is set to be less than a characteristic dimension in the upper region of the contact hole 224 and greater than a characteristic dimension at the bottom of the contact hole 224. Herein, the protrusion provided on the inclined face of the contact hole 224 is $SiN_x$, which has strongly adheres to the electrode 210, so that it can prevent an infiltration of the etchant liquid. Also, the inclined face of the contact hole 224 has a protrusion forming an overhang structure, so that it can further prevent an infiltration of the etchant liquid. The thickness of $SiN_x$ must be enough to ensure an adhesive force, and is formed to have thickness ranging from more than about 500 Å to less than about 1.5 times the thickness of the gate insulating film 212.

Meanwhile, a type of the etchant liquid used in the formation process according to the first and second embodiment of the present invention includes buffered oxide etch (BOE) and Buffered-HF, and the like, and the etchant gas includes $SF_6$ and $CF_4$, and the like.

As described above, according to the present invention, the electrode in contact with the active layer through one side of the inclined face of the contact hole and the bottom of the hole can be provided to reduce the width of the electrode. Accordingly, it becomes possible to realize a reduction of the contact face of the electrode formed through the contact hole in order to provide a small-size and light-weight panel. Furthermore, it becomes possible to prevent an infiltration of the etchant liquid occurring upon formation of the electrode and hence prevent substrate defects.

Although the present invention has been explained by the embodiments shown in the drawings described above, it should be understood to the person of ordinary skill in the art that the invention is not limited to the illustrative embodiments, but rather that various changes or modifications thereof are possible without departing from the spirit of the invention. Accordingly, the scope of the invention shall be determined only by the appended claims and their equivalents.

What is claimed is:

1. A thin film transistor substrate comprising:
a substrate;
an active layer overlying the substrate;
a first insulating layer for insulating the active layer overlying the substrate;
a second insulating layer comprising a material different from the first insulating layer overlying the active layer;
a third insulating layer overlying the second insulating layer;
a contact hole through the first, second, and third insulating layers that exposes a portion of the active layer; and
an electrode connected to the active layer and overlying only a portion of an inclined face of the contact hole, wherein the inclined face of the contact hole includes a protrusion formed by a portion of the second insulating layer creating an overhang structure.

2. The thin film transistor substrate as claimed in claim 1, wherein the first and third insulating layers comprise an inorganic insulating material, and the second insulating layer comprises an inorganic insulating material having good adhesive force to a metal and is different from the third insulating layer.

3. The thin film transistor substrate as claimed in claim 2, wherein the first and third insulating layers comprise $SiO_2$ and the second insulating layer comprises $SiN_x$.

4. The thin film transistor substrate as claimed in claim 1, wherein a size ratio of a bottom of the contact hole to a top of the contact hole is about 3~5:8~10, respectively and a size ratio of the bottom of the contact hole to a top of the electrode is about 3~5:7~9, respectively.

5. The thin film transistor substrate as claimed in claim 1, wherein the contact has a trapezoidal section.

6. A flat panel display comprising:
a thin film transistor having an active region;
a first, second and third insulating layers sequentially overlying the thin film transistor,
wherein the second insulating layer comprises a material different from the first insulating layer;
a contact opening through the first, second, and third insulating layers exposing a portion of the active region; and
an electrode connected to the active region and overlying only a portion of an inclined face of the contact hole, wherein the electrode has a characteristic dimension that is less than a characteristic dimension of the contact opening at an upper surface of the third insulating layer, but greater than a characteristic dimension of the contact opening at the active region.

7. The display of claim 6, wherein an inclined face of the contact opening includes a protrusion formed by a portion of the second insulating layer creating an overhang structure.

8. The display of claim 6, wherein a proportional ratio of the characteristic dimensions of the contact opening at the active region and the upper surface of the third insulating layer vary according to the ratio of about 3~5:8~10, respectively, and a proportional ratio of the characteristic dimensions of the contact opening at the active region and the electrode vary according to the ratio of about 3~5:7~9, respectively.

9. The display of claim 6, wherein the electrode comprises a drain electrode and wherein the active region comprises a drain of the thin film transistor.

10. The display of claim 9, wherein the drain electrode is connected to a pixel electrode.

11. The display of claim 6, wherein the electrode covers only a portion of the upper surface of the third insulating layer at the contact opening.

12. The display of claim 6, wherein the display comprises a liquid crystal display, a plasma display panel, an organic light emitting device, or a field emission display.

* * * * *